United States Patent
Lee (10) Patent No.: US 11,165,415 B2
(45) Date of Patent: Nov. 2, 2021

(54) RELAXATION OSCILLATOR AND METHOD

(71) Applicant: Samsung Electronics Co., Ltd., Suwon-si (KR)

(72) Inventor: Hankyu Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/858,849

(22) Filed: Apr. 27, 2020

(65) Prior Publication Data

US 2021/0167760 A1    Jun. 3, 2021

(30) Foreign Application Priority Data

Dec. 2, 2019    (KR) .................. 10-2019-0158493

(51) Int. Cl.
  *H03K 3/0231* (2006.01)
  *H03K 3/011* (2006.01)
  *H03K 3/354* (2006.01)
(52) U.S. Cl.
  CPC ........... *H03K 3/0231* (2013.01); *H03K 3/011* (2013.01); *H03K 3/354* (2013.01)
(58) Field of Classification Search
  CPC ........ H03K 3/0231; H03K 3/354; H03K 4/50; H03K 4/501; H03K 4/502; H03K 3/011; H03K 3/012; H03B 5/24
  See application file for complete search history.

(56) References Cited

U.S. PATENT DOCUMENTS 5,699,024 A    12/1997  Manlove et al.
6,157,270 A    12/2000  Tso
9,831,831 B2 *  11/2017  Savanth ................... H03K 4/50
10,826,465 B2 *  11/2020  Magod Ramakrishna ................... H03K 3/017
2013/0038364 A1   2/2013  Tokairin
2014/0002197 A1   1/2014  Patasani et al.
2015/0194929 A1   7/2015  Tokairin (Continued)

FOREIGN PATENT DOCUMENTS

JP    2009-253729 A    10/2009
JP       6498481 B2     4/2019
KR  10-2018-0087098 A    8/2018

OTHER PUBLICATIONS

Tokunaga et al., "An On-Chip CMOS Relaxation Oscillator with Power Averaging Feedback Using a Reference Proportional to Supply Voltage," ISSCC 2009 / Session 23 / PLLs and Clocks/ 23.8, 2009 IEEE International Solid-State Circuits Conference, 3 pages.

(Continued)

*Primary Examiner* — Ryan Johnson
(74) *Attorney, Agent, or Firm* — NSIP Law (57) ABSTRACT

A relaxation oscillator and a method of controlling the relaxation oscillator are disclosed. The relaxation oscillator includes a reference voltage generating circuit configured to generate a reference voltage based on a transistor-based resistor, a variable voltage generating circuit configured to generate a variable voltage based on the reference voltage and a control switch, a threshold voltage generating circuit configured to generate a threshold voltage using a switched-capacitor resistor circuit, and a switch control circuit configured to output a control signal to control the control switch based on the variable voltage and the threshold voltage.

24 Claims, 7 Drawing Sheets

(56) References Cited

U.S. PATENT DOCUMENTS

2016/0105187 A1    4/2016  J. et al.
2017/0272032 A1    9/2017  Cho et al.
2019/0235566 A1    8/2019  Ensafdaran
2019/0258282 A1    8/2019  Magod Ramakrishna et al.

OTHER PUBLICATIONS

Savanth et al., "A 0.68nW/kHz Supply-Independent Relaxation Oscillator with ±0.49%/V and 96ppm/°C. Stability," ARM, Cambridge, United Kingdom, University of Southampton, Southampton, United Kingdom, 3 pages.
Lee et al., "Wireless Power Receiver with Wide Dynamic Range for Biomedical Implants," 2019 IEEE Wireless Power Transfer Conference (WPTC), pp. 241-244.
Extended European Search Report dated May 3, 2021 in counterpart European Patent Application No. 20208529.6 (8 pages in English).

\* cited by examiner

RELAXATION OSCILLATOR AND METHOD

CROSS-REFERENCE TO RELATED APPLICATIONS

This application claims the benefit under 35 USC § 119(a) of Korean Patent Application No. 10-2019-0158493 filed on Dec. 2, 2019, in the Korean Intellectual Property Office, the entire disclosure of which is incorporated herein by reference for all purposes.

BACKGROUND

1. Field

The following description relates to a relaxation oscillator and method.

2. Description of Related Art

A typical oscillator is a circuit configured to generate a clock signal at a constant frequency and is used in various electronic devices. For example, the oscillator may generate a signal that changes stably and periodically over time to generate a system clock signal for controlling the timing of a system or to generate a carrier signal that converts a magnitude or a frequency of a signal. The oscillator may be classified into a linear or harmonic oscillator and a nonlinear or relaxation oscillator, which is also referred to as a charging/discharging oscillator, dependent on how it is implemented.

The relaxation oscillator may generate an oscillating signal by charging and/or discharging a capacitor, which is one of energy storages, within a threshold voltage that is internally defined in a circuit. When a voltage of both ends of the capacitor reaches the threshold voltage after the capacitor is charged, the relaxation oscillator may repeat an operation of abruptly discharging the capacitor, and may thus output an oscillation frequency of which a period is determined based on the charging and/or discharging time. The relaxation oscillator may be used as a low-power oscillator that may provide a synchronous clock signal to maintain synchronism between systems in wireless mobile communication, as a non-limiting example.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an oscillator includes a reference voltage generating circuit configured to generate a reference voltage based on a transistor-based resistor, a variable voltage generating circuit configured to generate a variable voltage based on the reference voltage and a control switch, a threshold voltage generating circuit configured to generate a threshold voltage using a switched-capacitor resistor circuit, and a switch control circuit configured to output a control signal to control the control switch based on the variable voltage and the threshold voltage.

The transistor-based resistor may be a metal-oxide-semiconductor field-effect transistor (MOSFET) resistor disposed in a chip in which the oscillator is implemented.

The variable voltage generating circuit may include a capacitive device configured to provide the variable voltage. The capacitive device may form a resistor-capacitor (RC) delay circuit along with the transistor-based resistor.

The switch control circuit may include a comparator configured to compare the variable voltage and the threshold voltage and determine a signal value of the control signal based on a result of the comparing.

In response to the variable voltage being greater than the threshold voltage, the switch control circuit may output the control signal to control the control switch to be on (i.e. closed).

When the control switch is on by the control signal, the variable voltage generating circuit may set a voltage value of the variable voltage to be a default voltage value.

In response to the variable voltage not being greater than the threshold voltage, the switch control circuit may output the control signal to control the control switch to be off (i.e. open).

The reference voltage generating circuit may generate the reference voltage irrespective of a magnitude of a source voltage to be applied to the reference voltage generating circuit.

The switch control circuit may further include a buffer circuit disposed at an output end of the comparator.

The threshold voltage generating circuit may include a frequency divider circuit configured to generate a first clock signal based on an output signal of the comparator, and a clock signal generating circuit configured to generate second clock signals to control switches included in the switched-capacitor resistor circuit based on the first clock signal.

The clock signal generating circuit may generate a plurality of nonoverlapping second clock signals. Each of the second clock signals may control a corresponding switch of the switched-capacitor resistor circuit.

The threshold voltage generating circuit may include a first switched-capacitor resistor circuit including a first capacitive device, and a second switched-capacitor resistor circuit including a second capacitive device.

A voltage value of the threshold voltage may be determined based on a capacitance of the first capacitive device and a capacitance of the second capacitive device.

The oscillator may be a relaxation oscillator.

In another general aspect, a method of controlling a oscillator includes generating a reference voltage using a reference voltage generating circuit including a transistor-based resistor, generating a variable voltage based on the reference voltage and a control switch, generating a threshold voltage using switched-capacitor resistor circuits, comparing the variable voltage and the threshold voltage and generating a control signal based on a result of the comparing, and controlling the control switch based on the control signal.

In response to the variable voltage being greater than the threshold voltage, the generating of the control signal may include generating the control signal to control the control switch to be on (i.e. closed).

In response to the variable voltage not being greater than the threshold voltage, the generating of the control signal may include generating the control signal to control the control switch to be off (i.e. open).

The generating of the threshold voltage may include generating a first clock signal using a frequency modulation circuit, and generating second clock signals to control switches included in the switched-capacitor resistor circuits based on the first clock signal.

In another general aspect, the oscillator includes a transistor-based resistor, a control switch, a switched-capacitor resistor circuit, and a switch control circuit. The transistor-based resistor is configured to generate a reference voltage. The control switch is configured to generate a variable voltage based on the reference voltage. The switched-capacitor resistor circuit is configured to generate a threshold voltage. The switch control circuit is configured to output a control signal to control the control switch based on the variable voltage and the threshold voltage. The switch control circuit is connected between the control switch and the switched-capacitor resistor circuit.

The reference voltage generating circuit may further include a plurality of diodes.

The transistor-based resistor may be a metal-oxide-semiconductor field-effect transistor (MOSFET) resistor disposed in a chip in which the oscillator is implemented, and the oscillator may be a relaxation oscillator.

A source end and a gate end of the MOSFET may be connected to a terminal of a source voltage, and a drain end of the MOSFET may be connected to one of the diodes.

A capacitive device may be connected in parallel to the control switch to generate the variable voltage, and the capacitive device may be configured to form a resistor-capacitor (RC) delay circuit in combination with the transistor-based resistor.

The switch control circuit may include a comparator configured to compare the variable voltage and the threshold voltage, and determine a signal value of the control signal based on a result of the comparing.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

Unless otherwise defined, all terms, including technical and scientific terms, used herein have the same meaning as commonly understood by one of ordinary skill in the art to which this disclosure pertains consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments.

Hereinafter, examples will be described in detail with reference to the accompanying drawings, and like reference numerals in the drawings refer to like elements throughout.

Figure 1:
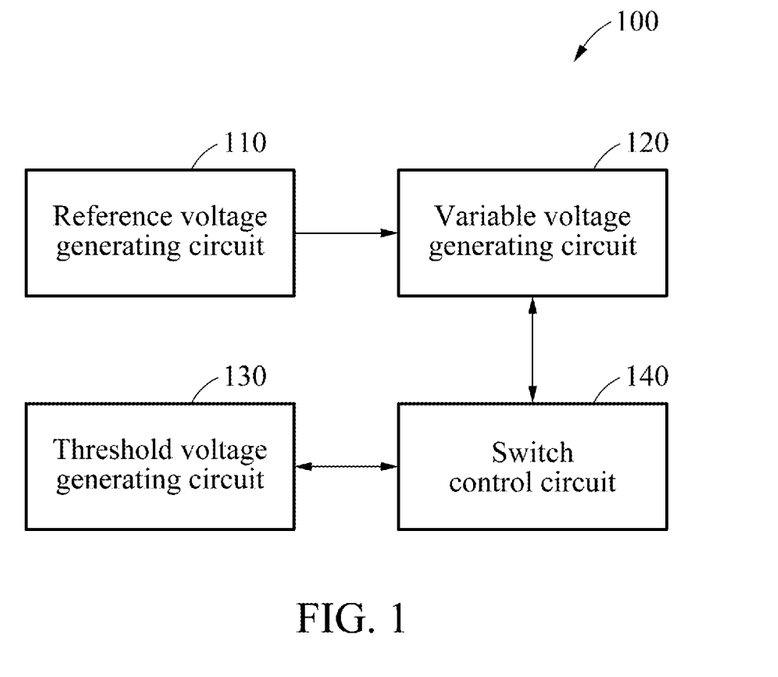
FIG. 1 is a diagram illustrating an example relaxation oscillator.

FIG. 1 is a diagram illustrating an example relaxation oscillator.

A relaxation oscillator 100 is a device configured to generate a signal having a predetermined period, such as, a clock signal, for example. The relaxation oscillator 100 may generate the oscillating signal by charging or discharging an energy storage device such as a capacitive device within a threshold voltage range that is internally set in a circuit. In an example, when a voltage of the energy storage device reaches or exceeds a threshold voltage when the energy storage device is being charged, the relaxation oscillator 100 may repeatedly discharge the energy storage device, and thereby provide an oscillation frequency having a predetermined time period.

The relaxation oscillator 100 may be used for, for example, a system using a low-power clock signal generator that operates by an accurate frequency, such as, for example, a wake-up timer, or an attachable or implantable microminiature medical devices. However, the use of the relaxation oscillator 100 is not limited to the example application fields described in the foregoing, and the relaxation oscillator 100 may be used in all areas that a low-power relaxation oscillator may be appropriate or desired.

In general, a low-power clock signal generator, such as a wake-up timer, may use a resistive voltage divider to reduce frequency changes that occur based on changes in voltage supplied. In such a case, due to a general resistor being used, a trade-off may occur between the amount of power consumed and the area used. For example, when using a general resistor with a high resistance value, for example, a fixed resistor, to reduce the amount of power consumption of a relaxation oscillator, a relatively large area may be desired for such a general resistor. In contrast, when using a general resistor with a low resistance value to reduce the area to be used, the amount of power consumption of the relaxation oscillator may be relatively higher.

Although to be described hereinafter in greater detail, the relaxation oscillator 100 may use a switched-capacitor resistor and a transistor-based resistor, and may thus remove such a trade-off relationship between the amount of power consumed and the size of area needed, which may reduce both the amount of power consumption and the area of the relaxation oscillator 100. In addition, the relaxation oscillator 100 may use the switched-capacitor and the transistor-based resistor, and may thus provide a stable performance that is robust against a change in manufacturing processes of the relaxation oscillator 100, a change in source voltage, and a change in temperature.

In FIG. 1, the relaxation oscillator 100 includes a reference voltage generating circuit 110, a variable voltage generating circuit 120, a threshold voltage generating circuit 130, and a switch control circuit 140.

The reference voltage generating circuit 110 may generate a reference voltage from a source voltage. The reference voltage may have a constant voltage value. The reference voltage generating circuit 110 may generate the reference voltage based on a transistor-based resistor. The transistor-based resistor may be, for example, a metal-oxide-semiconductor field-effect transistor (MOSFET) resistor disposed in a chip in which the relaxation oscillator 100 is implemented. The MOSFET resistor may have a relatively excellent resistance value that is continuously maintained with respect to the source voltage. For example, the MOSFET resistor may have a resistance value of tera-ohms. When the MOSFET resistor having such a high resistance value is arranged in the chip, the MOSFET resistor may form a resistor-capacitor (RC) delay circuit of the relaxation oscillator 100. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Using such a transistor-based resistor that may be implemented in a chip, the reference voltage generating circuit 110 may reduce an area to be used and generate a reference voltage that is irrelevant to a magnitude or a change of a source voltage to be applied to the reference voltage generating circuit 110. Thus, the source voltage may not affect an output frequency of the relaxation oscillator 100. In addition, using the transistor-based resistor as a resistor of the RC delay circuit, it is possible to obtain a considerably great resistance value only with a small area used, and thus reduce the amount of power consumption of the relaxation oscillator 100.

The reference voltage generated in the reference voltage generating circuit 110 may be provided to the variable voltage generating circuit 120. The variable voltage generating circuit 120 may generate a variable voltage that varies over time. The variable voltage generating circuit 120 may generate the variable voltage based on the reference voltage generated in the reference voltage generating circuit 110 and a control switch, and include an energy storage device that provides the variable voltage. The energy storage device may be a capacitive device, for example. As energy to be accumulated in the capacitive device changes over time, the voltage value of the variable voltage may change over time. The capacitive device may be charged and discharged repeatedly by the control switch, and an operation of the control switch may be controlled by a control signal to be transmitted from the switch control circuit 140. The capacitive device may include one or more capacitors or other capacitive elements.

In an example, when the capacitive device is discharged, a variable voltage that is supplied by the capacitive device may become a ground (GND) voltage. When the capacitive device is charged, the variable voltage may begin to increase towards a voltage value of the reference voltage from the GND voltage. In this example, when the control switch is switched on by the control signal while the variable voltage is increasing, the variable voltage may decrease to the GND voltage again. Here, the term "switched on" may indicate that the switch is closed, and the term "switch off" may indicate that the switch is opened.

The variable voltage generating circuit 120 may be connected to the reference voltage generating circuit 110. The capacitive device included in the variable voltage generating circuit 120 may form the RC delay circuit along with the transistor-based resistor included in the reference voltage generating circuit 110. The variable voltage generating circuit 120 may also be connected to the switch control circuit 140, and provide the generated variable voltage to the switch control circuit 140. In addition, the variable voltage generating circuit 120 may receive the control signal for controlling the control switch from the switch control circuit 140.

The threshold voltage generating circuit 130 may generate a threshold voltage to be used as a reference for comparison with the variable voltage. The threshold voltage generating circuit 130 may generate the threshold voltage using a switched-capacitor resistor circuit. In an example, the threshold voltage generating circuit 130 may include a plurality of switched-capacitor resistor circuits, a frequency divider circuit, and a clock signal generating circuit. For example, the switched-capacitor resistor circuits may include a first switched-capacitor resistor circuit including a first capacitive device, and a second switched-capacitor resistor circuit including a second capacitive device. In this example, a voltage value of the threshold voltage generated by the threshold voltage generating circuit 130 may be determined based on a capacitance of the first capacitive device and a capacitance of the second capacitive device. Using the switched-capacitor resistor circuit, instead of a general resistor, it may be possible to reduce the area and the amount of power consumption desired to generate a threshold voltage.

The frequency divider circuit may generate a first clock signal based on an output signal of a comparator of the switch control circuit 140. For example, the frequency divider circuit may convert the output signal of the comparator to the first clock signal having a 50% duty ratio and output the first clock signal. The clock signal generating circuit may generate second clock signals for controlling switches included in the switched-capacitor resistor circuit based on the first clock signal generated by the frequency divider circuit. Here, the clock signal generating circuit may generate nonoverlapping second clock signals, and each of the second clock signals may control a corresponding switch of the switched-capacitor resistor circuit.

The switch control circuit 140 may generate the control signal for controlling the control switch of the variable voltage generating circuit 120 based on the variable voltage and the threshold voltage, and output the generated control signal. The control signal may control the control switch to be on or off, periodically, in order to periodically charge or discharge the capacitive device of the variable voltage generating circuit 120.

In an example, the switch control circuit 140 may include the comparator configured to compare the variable voltage and the threshold voltage, and determine a signal value of the control signal based on a result of the comparison. In response to the variable voltage being higher than the threshold voltage, the comparator may output the control signal to control the control switch to be switched on (i.e. closed). When the control switch of the variable voltage generating circuit 120 is switched on by the control signal, the variable voltage generating circuit 120 may set a voltage value of the variable voltage to be a default voltage value, for example, a GND voltage value. In response to the variable voltage not being higher than the threshold voltage, the comparator may output the control signal to control the control switch to be switched off (i.e. open). When the control switch of the variable voltage generating circuit 120 is switched off by the control signal, the capacitive device of the variable voltage generating circuit 120 may continue to be charged, and the voltage value of the variable voltage may increase gradually.

According to an example, the switch control circuit 140 may further include a buffer circuit disposed at an output end of the comparator. The buffer circuit may connect the comparator and other components such that there is no electrical issue or trouble occurring between the comparator and the other components to which an output of the comparator is provided. The buffer circuit may include two inverters connected in series, and make a waveform of an output signal of the comparator sharper.

The relaxation oscillator 100 may generate a constant frequency irrespective or independent of the source voltage using the transistor-based resistor, and may implement a resistor having a relatively large resistance value and a relatively small area in a chip. In addition, using the transistor-based resistor as the resistor of the RC delay circuit, it may be possible to implement the relaxation oscillator 100 as a low-power relaxation oscillator in a limited size of an area. Further, through such components described above, it is possible to generate a frequency of the relaxation oscillator 100 robustly against a change in ambient temperature.

Figure 2:
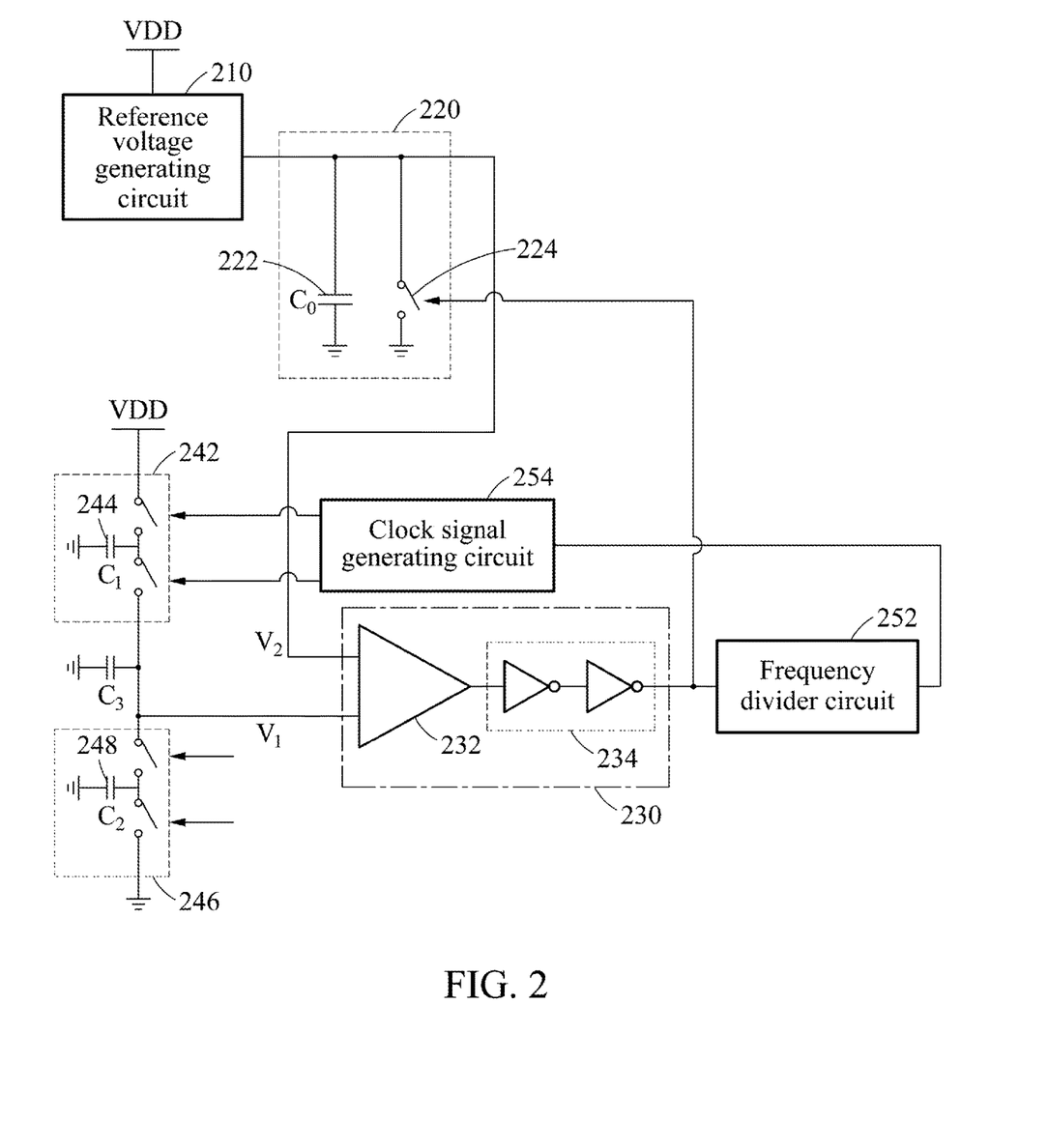
FIG. 2 is a diagram illustrating an example circuit implementing a relaxation oscillator.

FIG. 2 is a diagram illustrating an example circuit implementation of a relaxation oscillator.

In FIG. 2, a relaxation oscillator includes a reference voltage generating circuit 210, a variable voltage generating circuit 220, a switch control circuit 230, and a threshold voltage generating circuit, as a non-limiting example.

The reference voltage generating circuit 210 receives a source voltage VDD, and provides a reference voltage $V_{REF}$ having a voltage value that is constant irrespective of the source voltage VDD. The reference voltage generating circuit 210 generates the reference voltage $V_{REF}$ based on a transistor-based resistor. The transistor-based resistor may be a MOSFET resistor implemented in a chip, for example. To achieve a low power of the relaxation oscillator, a resistor having a relatively large resistance value may be used. Thus, using the MOSFET resistor that is implementable in the chip, it may be possible to reduce or remove the influence of the source voltage VDD from a frequency of the relaxation oscillator with variously reduced design areas and unit costs of production.

Figure 3:
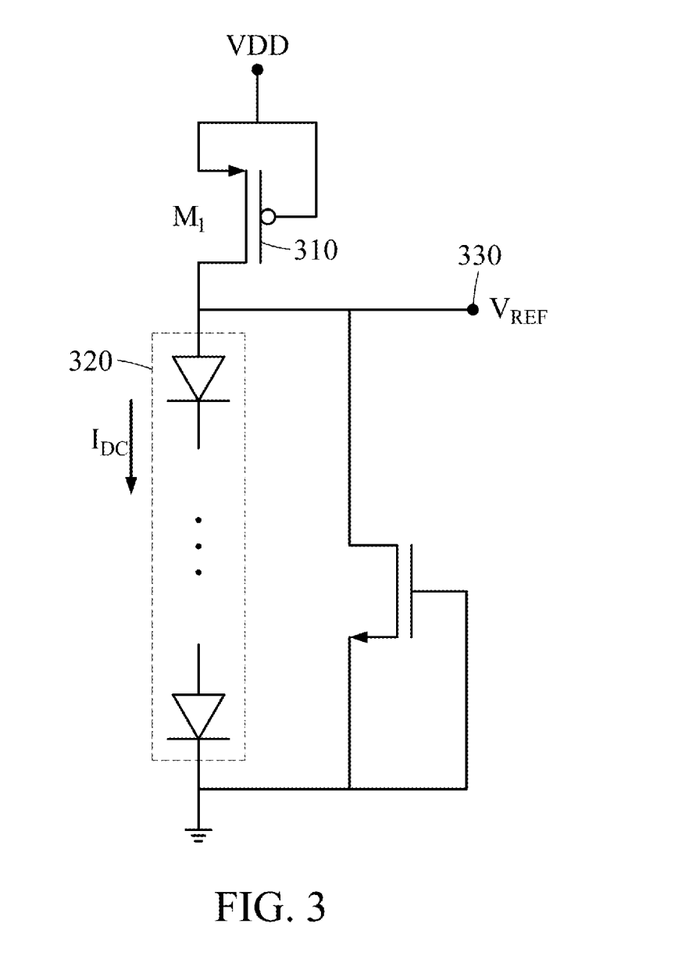
FIG. 3 is a diagram illustrating an example circuit implementing a reference voltage generating circuit.

An example circuit in which the reference voltage generating circuit 210 may be implemented will be described hereinafter with reference to FIG. 3. In FIG. 3, the reference voltage generating circuit 210 may be connected to a terminal from which the source voltage VDD is supplied, and the source voltage VDD may be supplied to a MOSFET $M_1$ 310 which is a transistor device. The MOSFET $M_1$ 310 may perform the function of a resistor, and may be disposed in a chip of a circuit in which the relaxation oscillator is implemented. The reference voltage generating circuit 210 may include a plurality of diodes 320 connected in series, and a current $I_{DC}$ flowing in the diodes 320. A source end and a gate end of the MOSFET $M_1$ 310 are connected to the terminal from which the source voltage VDD is supplied, and a drain end of the MOSFET $M_1$ 310 is connected to an output terminal 330 and one of the diodes 320. The reference voltage $V_{REF}$ having a constant voltage value may be generated based on the MOSFET $M_1$ 310 and the current $I_{DC}$, and may be output through the output terminal 330. The reference voltage $V_{REF}$ may be transmitted to the variable voltage generating circuit 220. The MOSFET $M_1$ 310 may operate as a resistor forming an RC delay circuit of the relaxation oscillator.

Figure 4:
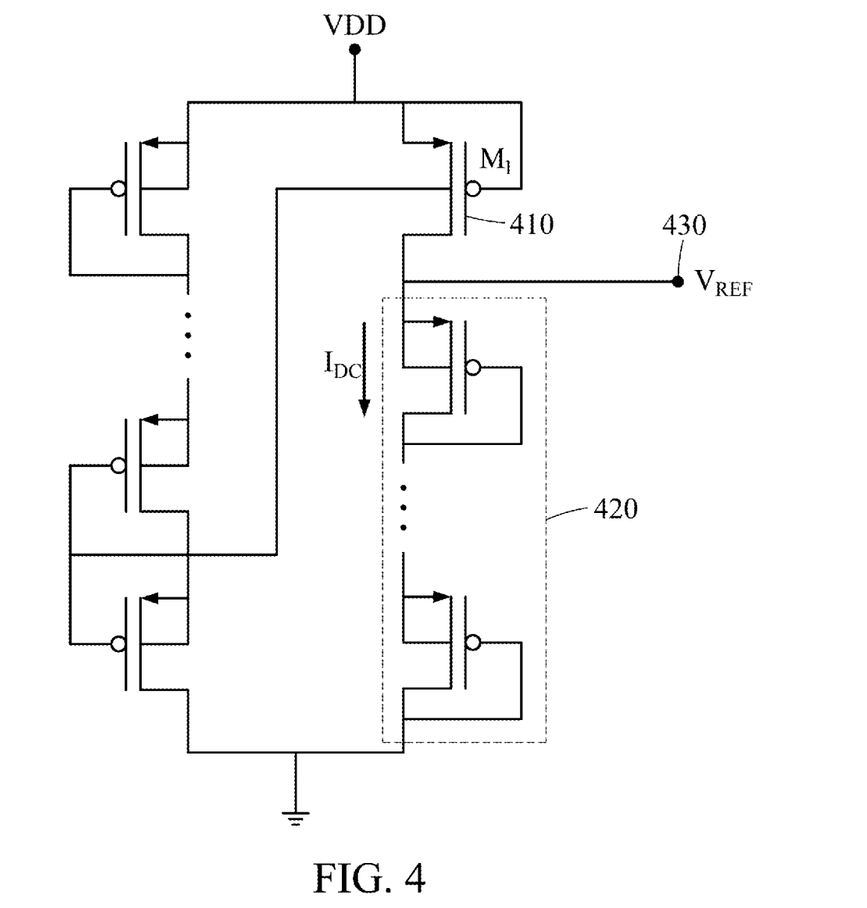
FIG. 4 is a diagram illustrating an example circuit implementing a reference voltage generating circuit.

FIG. 4 is a diagram illustrating an example circuit implementing the reference voltage generating circuit 210. In FIG. 4, similar to the example illustrated in FIG. 3, the reference voltage generating circuit 210 may be connected to a terminal from which the source voltage VDD is supplied, and the source voltage VDD is supplied to a MOSFET $M_1$ 410, which is a transistor device. The reference voltage generating circuit 210 of FIG. 4 may include a plurality of transistor devices 420 in which a current $I_{DC}$ flows, e.g., instead of a plurality of diodes as illustrated in FIG. 3. The reference voltage generating circuit 210 generates the reference voltage $V_{REF}$ having a constant voltage value based on the MOSFET $M_1$ 410 and the current $I_{DC}$. The reference voltage $V_{REF}$ may be transmitted to the variable voltage generating circuit 220 through an output terminal 430. A source end and a gate end of the MOSFET $M_1$ 410 are connected to the terminal from which the source voltage VDD is supplied. A drain end of the MOSFET $M_1$ 410 is connected to the output terminal 430 and one of the transistor devices 420.

Referring back to FIG. 2, the variable voltage generating circuit 220 receives the reference voltage $V_{REF}$ generated by the reference voltage generating circuit 210. The variable voltage generating circuit 220 includes a capacitor $C_0$ 222 and a control switch 224. The capacitor $C_0$ 222 accumulates electric charges supplied from the reference voltage $V_{REF}$. A voltage of both ends of the capacitor $C_0$ 222 corresponds to a variable voltage $V_2$ generated by the variable voltage generating circuit 220. The control switch 224 may be controlled to be on or off by a control signal generated by the switch control circuit 230. When the control switch 224 is switched on (i.e. closed), both ends of the capacitor $C_0$ 222 are connected to a GND voltage, and the capacitor $C_0$ 222 is discharged. When the control switch 224 is switched off (i.e. open) after the capacitor $C_0$ 222 is discharged, the capacitor $C_0$ 222 accumulates electric charges again based on the reference voltage $V_{REF}$, and the variable voltage $V_2$ starts to increase. The increment of the variable voltage $V_2$ may correspond to the capacitor $C_0$ 222 being charged. By the control switch 224, the capacitor $C_0$ 222 may be repeatedly charged or discharged, thereby a period may be formed. The capacitor $C_0$ 222 forms an RC delay circuit of the relaxation oscillator along with the transistor-based resistor included in the reference voltage generating device 210.

The threshold voltage generating circuit generates a threshold voltage $V_1$. The threshold voltage generating circuit includes a plurality of switched-capacitor resistor circuits 242 and 246, a frequency divider circuit 252, and a clock signal generating circuit 254.

The first switched-capacitor resistor circuit 242 includes a first capacitor $C_1$ 244, and the second switched-capacitor resistor circuit 246 includes a second capacitor $C_2$ 248. Each of the switches included in each of the switched-capacitor resistor circuits 242 and 246 may be controlled by a control signal generated by the clock signal generating circuit 254. A resistance value of the first switched-capacitor resistor circuit 242 may be determined by an operation period of a switching operation of switches included in the first capacitor resistor circuit 242 and a capacitance of the first capacitor $C_1$ 244. A resistance value of the second switched-capacitor resistor circuit 246 may be determined by an operation period of a switching operation of switches included in the second capacitor resistor circuit 246 and a capacitance of the second capacitor $C_2$ 248. One end of the first switched-capacitor resistor circuit 242 is connected to the source voltage VDD, and the first switched-capacitor resistor circuit 242 and the second switched-capacitor resistor circuit 246 are connected in series. Through such a circuit structure, the switched-capacitor resistor circuits 242 and 246 may perform a function of a voltage divider. Using the switched-capacitor resistor circuits 242 and 246 as the voltage divider, it may be possible to reduce an amount of power consumption of the relaxation oscillator and an area used for the relaxation oscillator when compared to the typical oscillator.

The threshold voltage $V_1$ generated by the threshold voltage generating circuit may have a constant voltage value, and may be determined by a capacitance $C_1$ of the first capacitor $C_1$ 244 included in the first switched-capacitor resistor circuit 242 and a capacitance $C_2$ of the second capacitor $C_2$ 248 included in the second switched-capacitor resistor circuit 246. For example, the threshold voltage $V_1$ may be determined as represented by Equation 1.

$$V_1 = VDD \times \frac{C1}{C1 + C2} \quad \text{Equation 1}$$

The frequency divider circuit 252 generates a first clock signal based on an output signal of the switch control circuit 230. In an example, a waveform of the output signal of the switch control circuit 230, or more particularly, a comparator 232, may have a form of spike, and the frequency divider circuit 252 may convert the output signal of the switch control circuit 230 to the first clock signal having a 50% duty ratio and output the first clock signal. The first clock signal, which is an output signal of the frequency divider circuit 252, is transmitted to the clock signal generating circuit 254.

The clock signal generating circuit 254 generates second clock signals to control switches included in the switched-capacitor resistor circuits 242 and 246 based on the first clock signal. The second clock signals generated by the clock signal generating circuit 254 may not overlap in terms of on-time, and each of the second clock signals may control a corresponding switch of the switched-capacitor resistor circuits 242 and 246.

The switch control circuit 230 generates a control signal to control the control switch 224 of the variable voltage generating circuit 220. The threshold voltage $V_1$ and the variable voltage $V_2$ are input to the switch control circuit 230. The switch control circuit 230 includes the comparator 232 configured to compare the input threshold voltage $V_1$ and the input variable voltage $V_2$ and output an output signal of different values based on a result of the comparing.

In response to the variable voltage $V_2$ being greater than the threshold voltage $V_1$, the comparator 232 outputs a control signal, for example, a high logic value, to control the control switch 224 to be on (i.e. closed). When the control switch 224 is switched on by the control signal, the capacitor $C_0$ 222 is discharged. In contrast, in response to the variable voltage $V_2$ not being greater than the threshold voltage $V_1$, the comparator 232 outputs a control signal, for example, a low logic value, to control the control switch 224 to be off (i.e. open). When the control switch 224 is switched off by the control signal, the capacitor $C_0$ 222 is continuously charged based on the reference voltage $V_{REF}$, and the variable voltage $V_2$ increases gradually.

When the variable voltage $V_2$ that is increasing continuously becomes higher than the threshold voltage $V_1$, the comparator 232 outputs a control signal to control the control switch 224 to be on, and accordingly, the capacitor $C_0$ 222 is discharged again. When the capacitor $C_0$ 222 is discharged, the variable voltage $V_2$ is initialized to be a GND voltage value or 0V. Thus, the variable voltage $V_2$ input to the comparator 232 becomes less than the threshold voltage $V_1$, and the comparator 232 then outputs a control signal to control the control switch 224 to be off. Thus, the capacitor $C_0$ 222 starts to be charged again.

According to an example, the switch control circuit 230 may further include a buffer circuit 234 disposed at an output end of the comparator 232. For example, the buffer circuit 234 may include two inverters connected in series, and be used to make a waveform of an output signal of the comparator 232 sharper.

In addition, each time a short pulse occurs in an output signal of the switch control circuit 230, an output of the frequency divider circuit 252 is toggled. For example, each time a short pulse occurs in an output signal of the switch control circuit 230, an output of the frequency divider circuit 252 may be changed from a high logic value to a low logic value, or from a low logic value to a high logic value.

Figure 5:
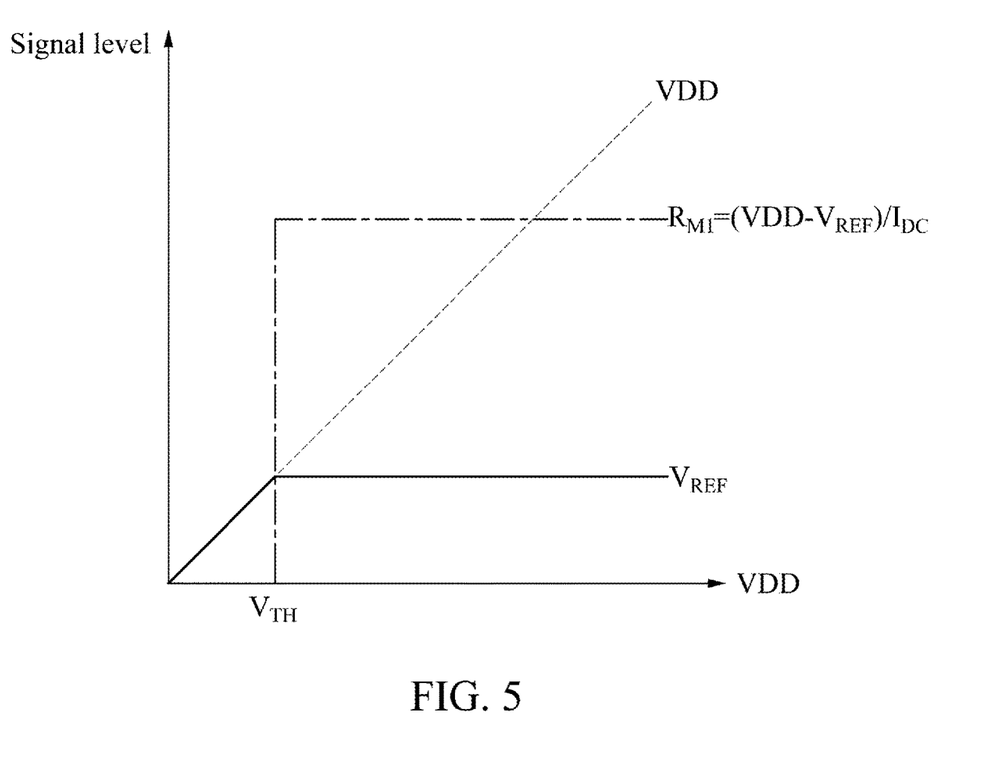
FIG. 5 is a diagram illustrating an example of changes in reference voltage and in transistor-based resistances based on a magnitude of a source voltage.

FIG. 5 is a diagram illustrating an example of changes in reference voltage and in transistor-based resistances based on a magnitude of a source voltage.

FIG. 5 illustrates a graph indicating a change of a reference voltage $V_{REF}$ and a change of a resistance $R_{M1}$ of MOSFET $M_1$ that occur when a source voltage VDD increases in a structure of a reference voltage generating circuit illustrated in FIG. 3 or 4. Referring to the graph, when the source voltage VDD becomes greater than or equal to a threshold voltage VTH, the reference voltage $V_{REF}$ and the resistance $R_{M_1}$ of the MOSFET $M_1$ are saturated to be constant values. The threshold voltage VTH may correspond to a minimum gate-source voltage that is needed to generate a conduction path between a source end and a drain end of the MOSFET $M_1$. As described above, the MOSFET $M_1$, which is a transistor device, may be used as a resistor of an RC delay circuit of a relaxation oscillator, and it may be thus possible to implement the relaxation oscillator that generates a constant frequency irrespective of a change in the source voltage VDD.

Figure 6:
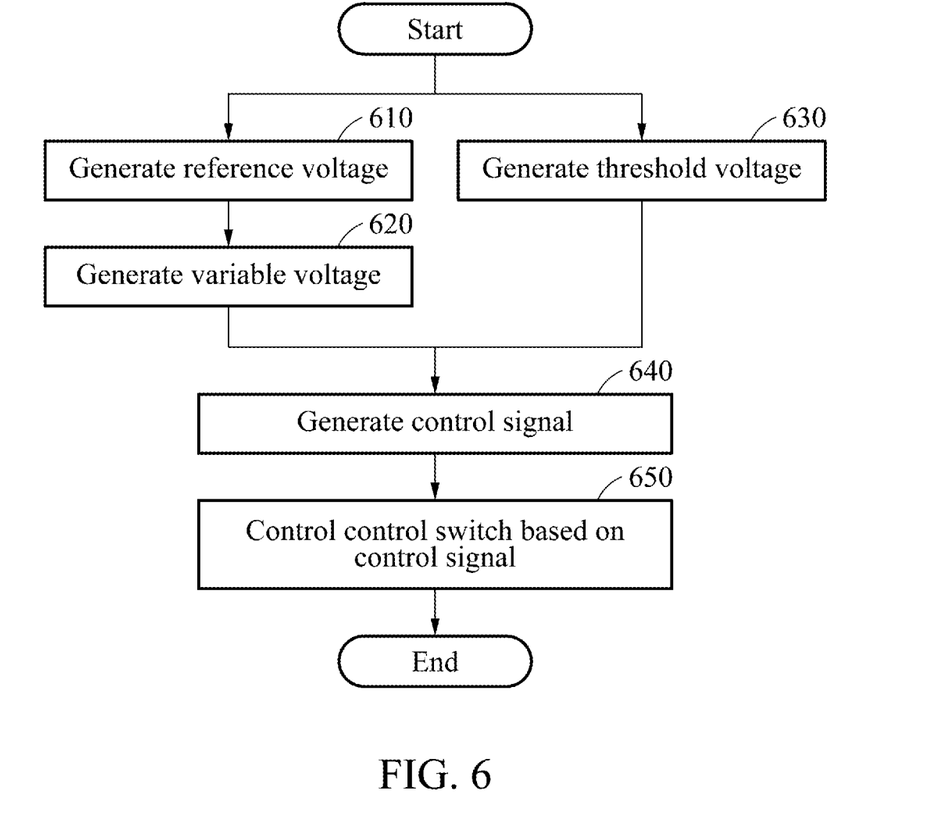
FIG. 6 is a flowchart illustrating an example method of controlling a relaxation oscillator.

FIG. 6 is a flowchart illustrating an example method of controlling a relaxation oscillator.

In FIG. 6, in operation 610, a relaxation oscillator generates a reference voltage using a reference voltage generating circuit, including a transistor-based resistor. The reference voltage may have a constant value irrespective of a magnitude of a source voltage to be applied to the reference voltage generating circuit. The transistor-based resistor may be a MOSFET resistor disposed in a chip in which the relaxation oscillator is implemented. The transistor-based resistor may form an RC delay circuit along with a capacitive device configured to provide a variable voltage.

In operation 620, the relaxation oscillator may generate a variable voltage using a variable voltage generating circuit. The variable voltage generating circuit may include the capacitive device configured to accumulate electric charges based on the reference voltage and a control switch configured to control the variable voltage in which a change in a quantity of electric charges of the capacitive device is reflected. The variable voltage generating circuit may generate the variable voltage under the control of the control switch. The capacitive device may be repeatedly charged and discharged by the control switch, and an operation of the control switch may be controlled by a control signal generated by a switch control circuit.

In operation 630, the relaxation oscillator generates a threshold voltage using a threshold voltage generating circuit, including switched-capacitor resistor circuits. The threshold voltage may be used as a reference to be compared with the variable voltage. In an example, the relaxation oscillator may generate a first clock signal using a frequency modulation circuit, and generate second clock signals for controlling switches included in the switched-capacitor resistor circuits based on the generated first clock signal. The second clock signals may control operations of the switches included in the switched-capacitor resistor circuits on a periodic basis, and thus each of the switched-capacitor resistor circuits may perform a function of a resistor. A voltage value of the threshold voltage may be determined based on a resistance value of the switched-capacitor resistor circuits and a source voltage.

In operation 640, the relaxation oscillator generates a control signal for controlling the control switch of the variable voltage generating circuit using a comparator. The comparator may compare the variable voltage generated in operation 620 and the threshold voltage generated in operation 630. The comparator may generate the control signal for controlling the control switch based on a result of the comparing. In response to the variable voltage being greater than the threshold voltage, the comparator may generate the control signal to control the control switch to be on (i.e. closed). In contrast, in response to the variable voltage not being greater than the threshold voltage, the comparator may generate the control signal to control the control switch to be off (i.e. open).

In operation 650, the relaxation oscillator may control the control switch of the variable voltage generating circuit based on the control signal generated in operation 640. When the control switch is switched on by the control signal, the capacitive device of the variable voltage generating circuit may be discharged, and the variable voltage may be set to be a default voltage value. Subsequently, as the variable voltage changes, the control signal for controlling the control switch to be off may be generated, and the control switch may then be off, and the capacitive device may be charged. As the capacitive device is charged, the variable voltage may increase gradually. When the variable voltage that is increasing gradually becomes greater than the threshold voltage, the control signal for controlling the control switch to be on may be generated again, and the capacitive device may be discharged again.

As described above, the variable voltage may change over time by the capacitive device that is charged and discharged repeatedly based on time, and the relaxation oscillator may generate a periodic signal based on the variable voltage and the threshold voltage of a fixed value.

Figure 7:
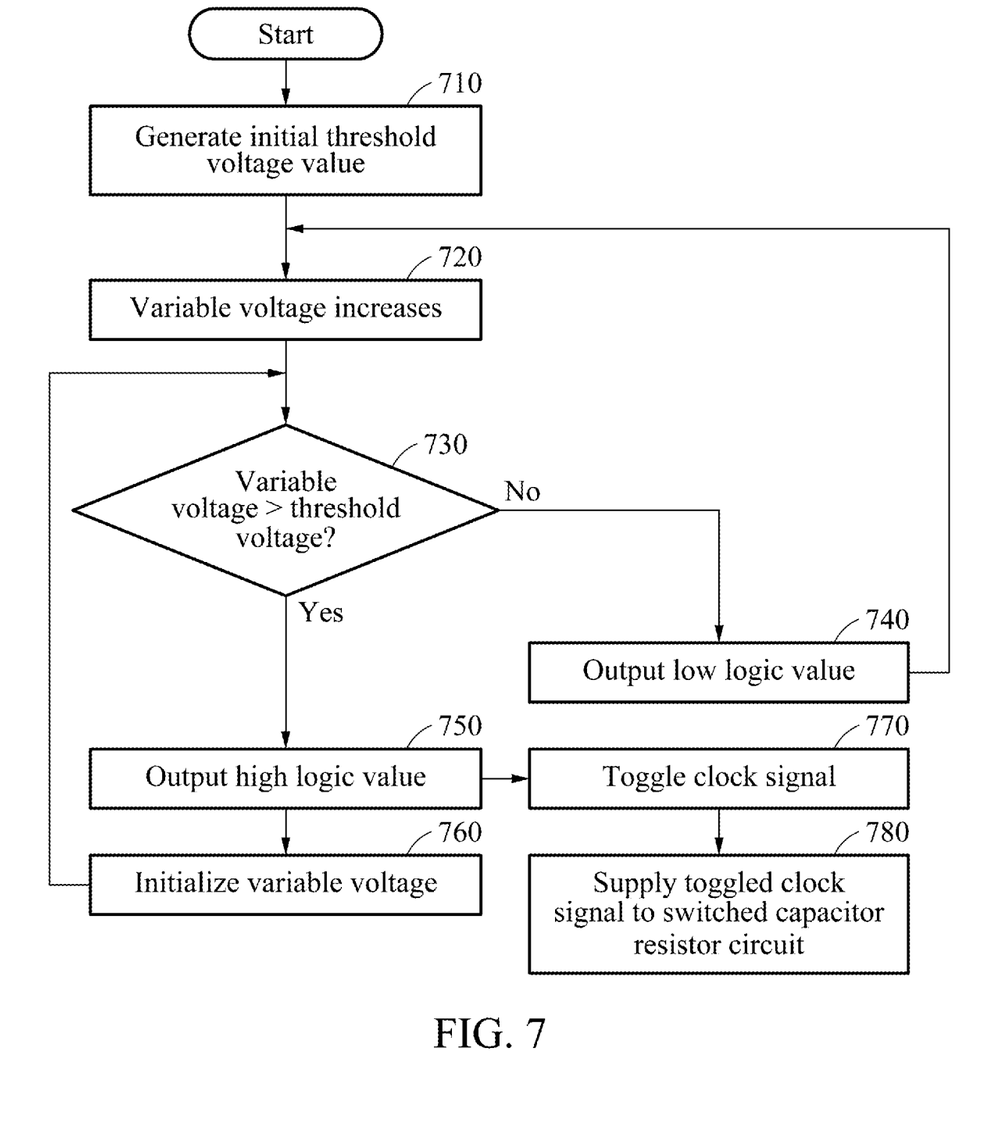
FIG. 7 is a flowchart illustrating an example method of a relaxation oscillator.

FIG. 7 is a flowchart illustrating an example method of a relaxation oscillator.

In FIG. 7, in operation 710, an initial threshold voltage value of a threshold voltage generating circuit is generated. In an initial stage of a relaxation oscillator, a source voltage VDD starts to be supplied, and a clock signal may not be supplied yet to switched-capacitor resistor circuits of the threshold voltage generating circuit. Thus, the initial threshold voltage value may be set to be a value of VDD/2, for example. In addition, a reference voltage generating circuit starts to operate based on the source voltage VDD, and a reference voltage of a constant value may be generated from the reference voltage generating circuit.

In operation 720, a variable voltage generating circuit may start to operate based on the reference voltage generated from the reference voltage generating circuit, and a variable voltage which is an output signal of the variable voltage generating circuit may start to increase.

In operation 730, the variable voltage and a threshold voltage are compared by a comparator included in a control signal generating circuit. In operation 740, in response to the variable voltage not being greater than the threshold voltage, an output signal of a low logic value may be output from the comparator. In operation 750, in response to the variable voltage being greater than the threshold voltage, an output signal of a high logic value may be output from the comparator.

When the output signal of the low logic value is output from the comparator, a control switch of the variable voltage generating circuit is maintained to be off, and operation 720 is performed, and the variable voltage continues increasing. In contrast, when the output signal of the high logic value is output from the comparator, the control switch of the variable voltage generating circuit is on, and the variable voltage is initialized in operation 760. Subsequently, the initialized variable voltage may be input to the comparator, and the output signal of the low logic value is output from the comparator through operation 730. Thus, the control switch of the variable voltage generating circuit is switched off, and operation 720 is performed and the variable voltage starts increasing. When the comparator outputs the output signal of the high logic value, a short time later, the output signal of the low logic value is output again. The output signal of the low logic value is maintained until right before the variable voltage becomes greater than the threshold voltage, and thus the output signal of the comparator may exhibit a form of which a short pulse signal is repeated periodically.

An output of the comparator is transmitted to a frequency divider circuit. When the output signal of the high logic value is output from the comparator, a clock signal output through the frequency divider circuit and a clock signal generating circuit is toggled in operation 770. In operation 780, the clock signal toggled in operation 770 is supplied to switches of switched-capacitor resistors included in the threshold voltage generating circuit, and a threshold voltage of a constant value is generated by the clock signal and transmitted to the comparator.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. An oscillator comprising:
    a reference voltage generating circuit configured to generate a reference voltage using a transistor-based resistor;
    a variable voltage generating circuit, configured to generate a variable voltage based on the reference voltage and a control switch, comprising a capacitive device configured to provide the variable voltage, wherein the capacitive device is configured to form a resistor-capacitor (RC) delay circuit along with the transistor-based resistor;
    a threshold voltage generating circuit configured to generate a threshold voltage using a switched-capacitor resistor circuit; and
    a switch control circuit configured to output a control signal to control the control switch based on the variable voltage and the threshold voltage.

2. The oscillator of claim 1, wherein the transistor-based resistor is a metal-oxide-semiconductor field-effect transistor (MOSFET) resistor disposed in a chip in which the oscillator is implemented.

3. The oscillator of claim 1, wherein the switch control circuit comprises:
    a comparator configured to compare the variable voltage and the threshold voltage and set a signal value of the control signal based on a result of the comparing.

4. The oscillator of claim 3, wherein the switch control circuit further comprises:
    a buffer circuit disposed at an output of the comparator.

5. The oscillator of claim 3, wherein the threshold voltage generating circuit comprises:
    a frequency divider circuit configured to generate a first clock signal based on an output signal of the comparator; and
    a clock signal generating circuit configured to generate second clock signals to control switches comprised in the switched-capacitor resistor circuit based on the first clock signal.

6. The oscillator of claim 5, wherein the clock signal generating circuit is configured to generate a plurality of nonoverlapping second clock signals,
    wherein each of the second clock signals is configured to control a corresponding switch of the switched-capacitor resistor circuit.

7. The oscillator of claim 1, wherein, in response to the variable voltage being greater than the threshold voltage, the switch control circuit is configured to output the control signal to control the control switch to switch on.

8. The oscillator of claim 7, wherein the variable voltage generating circuit is configured, dependent on the control switch being on, to seta voltage value of the variable voltage to be a default voltage value.

9. The oscillator of claim 1, wherein the switch control circuit is configured, dependent on the variable voltage not being greater than the threshold voltage, to output the control signal to control the control switch to switch off.

10. The oscillator of claim 1, wherein the reference voltage generating circuit is configured to generate the reference voltage irrespective of a magnitude of a source voltage applied to the reference voltage generating circuit.

11. The oscillator of claim 1, wherein the threshold voltage generating circuit comprises:
    a first switched-capacitor resistor circuit comprising a first capacitive device; and
    a second switched-capacitor resistor circuit comprising a second capacitive device.

12. The oscillator of claim 11, wherein a voltage value of the threshold voltage is determined based on a capacitance of the first capacitive device and a capacitance of the second capacitive device.

13. The oscillator of claim 1, wherein the oscillator is a relaxation oscillator.

14. A method of controlling an oscillator, the method comprising:
    generating a reference voltage using a transistor-based resistor of a reference voltage generating circuit, wherein the transistor-based resistor forms a resistor-capacitor (RC) delay circuit along with a capacitive device configured to providing the variable voltage;
    generating a variable voltage based on the reference voltage and a control switch;
    generating a threshold voltage using switched-capacitor resistor circuits;
    comparing the variable voltage and the threshold voltage, and generating a control signal based on a result of the comparing; and
    controlling the control switch based on the control signal.

15. The method of claim 14, wherein the transistor-based resistor is a metal-oxide-semiconductor field-effect transistor (MOSFET) resistor disposed in a chip in which the oscillator is implemented.

16. The method of claim 14, wherein the reference voltage generating circuit generates the reference voltage irrespective of a magnitude of a source voltage applied to the reference voltage generating circuit.

17. The method of claim 14, wherein the generating of the control signal comprises:

in response to the variable voltage being greater than the threshold voltage, generating the control signal to control the control switch to switch on.

18. The method of claim 14, wherein the generating of the control signal comprises:
in response to the variable voltage not being greater than the threshold voltage, generating the control signal to control the control switch to switch off.

19. The method of claim 14, wherein the generating of the threshold voltage comprises:
generating a first clock signal using a frequency modulation circuit; and
generating second clock signals to control switches of switched-capacitor resistor circuits based on the first clock signal.

20. An oscillator comprising:
a reference voltage generating circuit comprising a transistor-based resistor configured to generate a reference voltage;
a control switch configured to generate a variable voltage based on the reference voltage;
a switched-capacitor resistor circuit configured to generate a threshold voltage; and
a switch control circuit configured to output a control signal to control the control switch based on the variable voltage and the threshold voltage,
wherein the switch control circuit selectively connects the control switch and the switched-capacitor resistor circuit, and
wherein a capacitive device is connected in parallel the control switch to generate the variable voltage, and
the capacitive device is configured to form a resistor-capacitor (RC) delay circuit in combination with the transistor-based resistor.

21. The oscillator of claim 20, wherein the reference voltage generating circuit further comprises a plurality of diodes connected in series to generate a current.

22. The oscillator of claim 21, wherein the transistor-based resistor is a metal-oxide-semiconductor field-effect transistor (MOSFET) resistor disposed in a chip in which the oscillator is implemented, and the oscillator is a relaxation oscillator.

23. The oscillator of claim 22, wherein a source end and a gate end of the MOSFET are connected to a terminal of a source voltage, and a drain end of the MOSFET is connected to one of the diodes.

24. The oscillator of claim 20, wherein the switch control circuit comprises:
a comparator configured to compare the variable voltage and the threshold voltage, and determine a signal value of the control signal based on a result of the comparing.

* * * * *